United States Patent
Nemes et al.

(10) Patent No.: US 11,754,096 B2
(45) Date of Patent: Sep. 12, 2023

(54) PILOT DEVICE FOR A DIRECTIONAL VALVE WITHOUT INTERNAL CABLE CONNECTIONS

(71) Applicant: Robert Bosch GmbH, Stuttgart (DE)

(72) Inventors: Benjamin Nemes, Budapest (HU); Carl Dissoubray, Budaors (HU); Christoph Keyl, Stuttgart (DE); Gergely Laszlo Hegedus-Fuchs, Hodmezovasarhely (HU); Jan-Peter Reibert, Weissach (DE); Matthias Beck, Neu-Ulm (DE); Peter Pozsega, Kaposvar (HU); Steffen Knapper, Vaihingen/Enz (DE); Matthias Lang, Roden (DE); Liebhart Zaiser, Karlstadt (DE); Thomas Haas, Fellen (DE)

(73) Assignee: Robert Bosch GmbH, Stuttgart (DE)

( * ) Notice: Subject to any disclaimer, the term of this patent is extended or adjusted under 35 U.S.C. 154(b) by 782 days.

(21) Appl. No.: 16/774,637

(22) Filed: Jan. 28, 2020

(65) Prior Publication Data
US 2020/0309162 A1   Oct. 1, 2020

(30) Foreign Application Priority Data
Mar. 27, 2019   (DE) ..................... 10 2019 204 246.5

(51) Int. Cl.
*F15B 13/04*   (2006.01)
*H01R 13/405*   (2006.01)
(Continued)

(52) U.S. Cl.
CPC ...... *F15B 13/0402* (2013.01); *F15B 13/0433* (2013.01); *F16K 37/0041* (2013.01);
(Continued)

(58) Field of Classification Search
CPC ................. H01F 27/306; H01R 13/405; F15B 2013/0409; Y10T 137/87209;
(Continued)

(56) References Cited

U.S. PATENT DOCUMENTS 6,374,814 B1 *   4/2002   Cook ................. F16K 37/0041
                                          123/568.21
6,612,332 B2 *   9/2003   Miyazoe ............... F15B 13/086
                                          137/557
(Continued)

FOREIGN PATENT DOCUMENTS

DE   38 34 815 C2   8/1996
DE   697 04 045 T2   5/2001
(Continued)

OTHER PUBLICATIONS

Bosch Rexroth AG, "Mobil-Wegeventil [Mobile Directional Valve] SB 23LS-EHS," Order No. 1 987 761 804, Edition 03.99 (1 page).

*Primary Examiner* — Matthew W Jellett
(74) *Attorney, Agent, or Firm* — Maginot, Moore & Beck LLP

(57) ABSTRACT

A pilot device for a hydraulic directional valve includes a displacement sensor, a pilot valve, an actuating device, a coil assembly, and a circuit board. The displacement sensor has a sensor axis and the pilot valve has a valve axis. The valve axis and the sensor axis are arranged substantially parallel to one another so as to lie in a reference plane. The actuating device and the coil assembly are arranged adjacent to one another. The circuit board is arranged parallel to the reference plane. In each case, to establish an electrical contact, the coil assembly, the actuating device, and an electrical plug connection are either soldered directly to the circuit board or are in breakable electrical contact with a respectively asso- (Continued)

ciated, rigid contact assembly. The contact assembly is soldered directly to the circuit board.

12 Claims, 6 Drawing Sheets

(51) Int. Cl.
| | | |
|---|---|---|
| H05K 7/14 | (2006.01) | |
| H01F 27/24 | (2006.01) | |
| H01F 27/28 | (2006.01) | |
| H05K 1/18 | (2006.01) | |
| F15B 13/043 | (2006.01) | |
| H01F 7/08 | (2006.01) | |
| H01F 27/30 | (2006.01) | |
| F16K 37/00 | (2006.01) | |
| F16K 31/06 | (2006.01) | |
| F16K 31/02 | (2006.01) | |

(52) U.S. Cl.
CPC ............... *H01F 7/08* (2013.01); *H01F 27/24* (2013.01); *H01F 27/28* (2013.01); *H01F 27/306* (2013.01); *H01R 13/405* (2013.01); *H05K 1/181* (2013.01); *H05K 7/1427* (2013.01); *F15B 2013/0409* (2013.01); *F15B 2211/30* (2013.01); *F15B 2211/329* (2013.01); *F16K 31/02* (2013.01); *F16K 31/0613* (2013.01); *F16K 37/0033* (2013.01); *H05K 2201/10053* (2013.01); *H05K 2201/10151* (2013.01); *Y10T 137/5987* (2015.04); *Y10T 137/8242* (2015.04)

(58) Field of Classification Search
CPC ..... Y10T 137/87193; Y10T 137/86614; Y10T 137/8242
See application file for complete search history.

(56) References Cited

U.S. PATENT DOCUMENTS

| | | | | |
|---|---|---|---|---|
| 6,840,273 | B2* | 1/2005 | Miyazoe | F15B 13/0402 137/554 |
| 8,479,768 | B2* | 7/2013 | Kunz | F15B 13/015 137/596.14 |
| 9,980,396 | B1* | 5/2018 | Folker | H01F 5/04 |
| 2019/0178265 | A1* | 6/2019 | Sakashita | F15B 13/10 |

FOREIGN PATENT DOCUMENTS

| | | | | |
|---|---|---|---|---|
| DE | 19724076 B4 * | 5/2005 | | F15B 13/0442 |
| EP | 2 280 179 B1 | 8/2016 | | |

* cited by examiner

PILOT DEVICE FOR A DIRECTIONAL VALVE WITHOUT INTERNAL CABLE CONNECTIONS

This application claims priority under 35 U.S.C. § 119 to patent application no. DE 10 2019 204 246.5, filed on Mar. 27, 2019 in Germany, the disclosure of which is incorporated herein by reference in its entirety.

BACKGROUND

The disclosure relates to a pilot device.

EP 2 280 179 B1 discloses a directional valve having a pilot device. The pilot device comprises a displacement sensor by means of which the position of a control spool can be measured. An electrical pilot valve is furthermore provided, by means of which the position of the control spool can be hydraulically adjusted. The displacement sensor and the pilot valve are connected via electrical cables to a circuit board which realizes a position control loop for the position of the control spool, wherein the displacement sensor provides an actual value of the position control system, wherein the manipulated variable of the position control system is supplied to the pilot valve, wherein the corresponding set value is delivered via a plug connection which is likewise connected to the circuit board.

From the information sheet "Mobil-Wegeventil [Mobile Directional Valve] SB 23LS-EHS" by Bosch Rexroth AG (Order No. 1 987 761 804; Edition 03.99), a similar pilot device is known, which is notable in that the pilot valve is arranged completely within the pilot device, which is not the case in EP 2 280 179 B1. The pilot device can therefore be replaced particularly easily in the event of damage.

Directional valves of this type are frequently used in mobile working machines or agricultural tractors. These are exposed to considerable jolting. Under these stresses, the electrical plug connection of the known pilot devices form a weak point which the present disclosure aims to prevent. The pilot device according to the disclosure is moreover intended to have a particularly compact design so that it can be used on directly adjacent displacement valves in a valve block. It is furthermore intended to be particularly easy and economical to produce and to install on the directional valve.

SUMMARY

According to the disclosure, it is proposed that the valve axis and the sensor axis are arranged substantially parallel to one another so that they lie in a reference plane, wherein the actuating device and the coil assembly are arranged adjacent to one another, wherein the circuit board is arranged parallel to the reference plane, wherein, to establish an electrical contact, the coil assembly, the actuating device and the electrical plug connection are either each soldered directly to the circuit board or are in breakable electrical contact with a respectively associated, rigid contact assembly, wherein the contact assembly is soldered directly to the circuit board. The coil assembly is preferably arranged between the actuating device and the electrical plug connection. The mounting surface is preferably formed to be planar, wherein it is aligned perpendicularly to the valve axis and to the sensor axis. The soft iron core is preferably formed to be elongated in the direction of the valve axis. The soft iron core is preferably fixedly connected, in particular screwed and/or crimped, to the valve spool.

Advantageous further developments and improvements of the disclosure are indicated in the dependent claims.

It can be provided that a contact assembly is associated with the actuating device, wherein the electrical plug connection and the coil assembly are soldered directly to the circuit board. The installation of the pilot valve is, in particular, simplified by this measure, whilst the pilot device still has a very simple design.

It can be provided that the contact assembly comprises at least two metal parts via which a breakable electrical contact can be established in each case, wherein the metal parts are soldered directly to the circuit board, wherein the metal parts are overmolded with a plastic sheath so that they are fixedly held by the plastic sheath. The metal parts are preferably produced from sheet metal by punching and/or bending. The plastic sheath is preferably produced in an injection molding procedure, wherein the metal parts are placed in the injection mold before the liquefied plastic is injected. The metal parts are held together in one piece by connecting webs during the injection molding procedure. The connecting webs are preferably arranged outside the plastic sheath, wherein they can be easily removed by breaking them off. The metal parts of the contact assembly are themselves preferably electrically insulated from one another.

It can be provided that the electrical contact between the actuating device and the associated contact assembly can be established and broken by a relative movement in the direction of the valve axis. The corresponding contact can thus be established in a particularly simple manner, in particular in the course of installing the assembly explained below, which comprises the cover. The metal parts in question preferably each have a planar contact tab, wherein all contact tabs are arranged parallel to one another and parallel to the valve axis.

It can be provided that the housing comprises a base body and a cover, wherein the mounting surface is arranged on the base body, wherein the cover is arranged on the side of the base body opposite the mounting surface, wherein the circuit board and the electrical plug connection and the coil assembly are fastened to the cover. This results in an assembly which can be installed as a whole on the remaining pilot device, wherein, in particular, the solder connections mentioned above can be easily established owing to their good accessibility. The cover is preferably screwed to the base body. The said parts preferably abut against one another at planar surfaces, which are most preferably aligned perpendicularly to the sensor axis or the valve axis. A seal is preferably incorporated between the cover and the base body, which seal is most preferably received in a groove in the base body. The base body preferably has a circuit board recess, wherein the base body projects into the circuit board recess.

It can be provided that the circuit board, the coil assembly, the electrical plug connection and the contact assembly project out of the cover so that the associated soldering points are accessible for a soldering operation, provided that the cover is not installed on the base body. The said soldering operation can thus be carried out in a particularly simple manner.

It can be provided that sections of the pilot valve are incorporated in a receiving bore in the base body in such a way that the fluid connection to the fluid feed, to the fluid return and to the first and to the second control connection extends exclusively in the base body. This results in particularly short and low-resistance flow paths, which can, moreover, be easily established. At least sections of the actuating device of the pilot valve can be surrounded by the cover in such a way that the cover is aligned relative to the housing via the actuating device.

It can be provided that a bracket, which extends in the direction of the sensor axis, is formed in one piece on the cover, wherein the circuit board is fastened to the bracket. The circuit board is thus supported in a stable manner so that it is not prone to mechanical vibrations under vibrational stress. Moreover, the bracket barely obstructs the accessibility of the circuit board for the soldering operation. The bracket preferably extends over the entire length of the circuit board. A heat-conductive paste is preferably arranged between the bracket and the circuit board so that heat produced on the circuit board can be dissipated to the environment with little resistance via the bracket and furthermore via the outer surface of the cover. The cover is preferably made of metal, most preferably aluminum or zinc. It is preferably produced in an injection molding procedure.

It can be provided that the coil assembly comprises a separate pressure pipe in which the soft iron core is arranged, wherein the pressure pipe is surrounded by a coil holder made of plastic, which supports the at least two coils, wherein the coil assembly is soldered to the circuit board in the region of a contact portion. The coil holder is preferably fastened to the cover, in particular screwed thereto. The pressure pipe is preferably made of a non-magnetic metal, wherein it is most preferably produced in a deep drawing procedure. Sections of the pressure pipe preferably border a space which is closed in a fluid-tight manner. For this purpose, the pressure pipe is preferably mounted in a fluid-tight manner on the base body.

It can be provided that the coil holder is formed in one piece, wherein it has a plate-like fastening portion which extends transversely to the sensor axis, wherein the fastening portion is fastened to the cover. The fastening portion is preferably screwed to the cover. The fastening portion is preferably arranged between the two coils.

It can be provided that the plastic sheath abuts directly against the fastening portion, wherein the plastic sheath and the fastening portion are penetrated by at least one common fastening screw, which is screwed into the cover.

It can be provided that the contact portion is formed in one piece on the coil holder, wherein it is arranged spaced from the fastening portion in the direction of the sensor axis. The corresponding soldering points on the circuit board are consequently easily accessible.

It goes without saying that the features mentioned above and those still to be explained below can be applied not only in the combination indicated in each case, but also in other combinations or in isolation, without deviating from the scope of the present disclosure.

BRIEF DESCRIPTION OF THE DRAWINGS

The disclosure is explained in more detail below, with reference to the accompanying drawings, which show.

DETAILED DESCRIPTION

Figure 1:
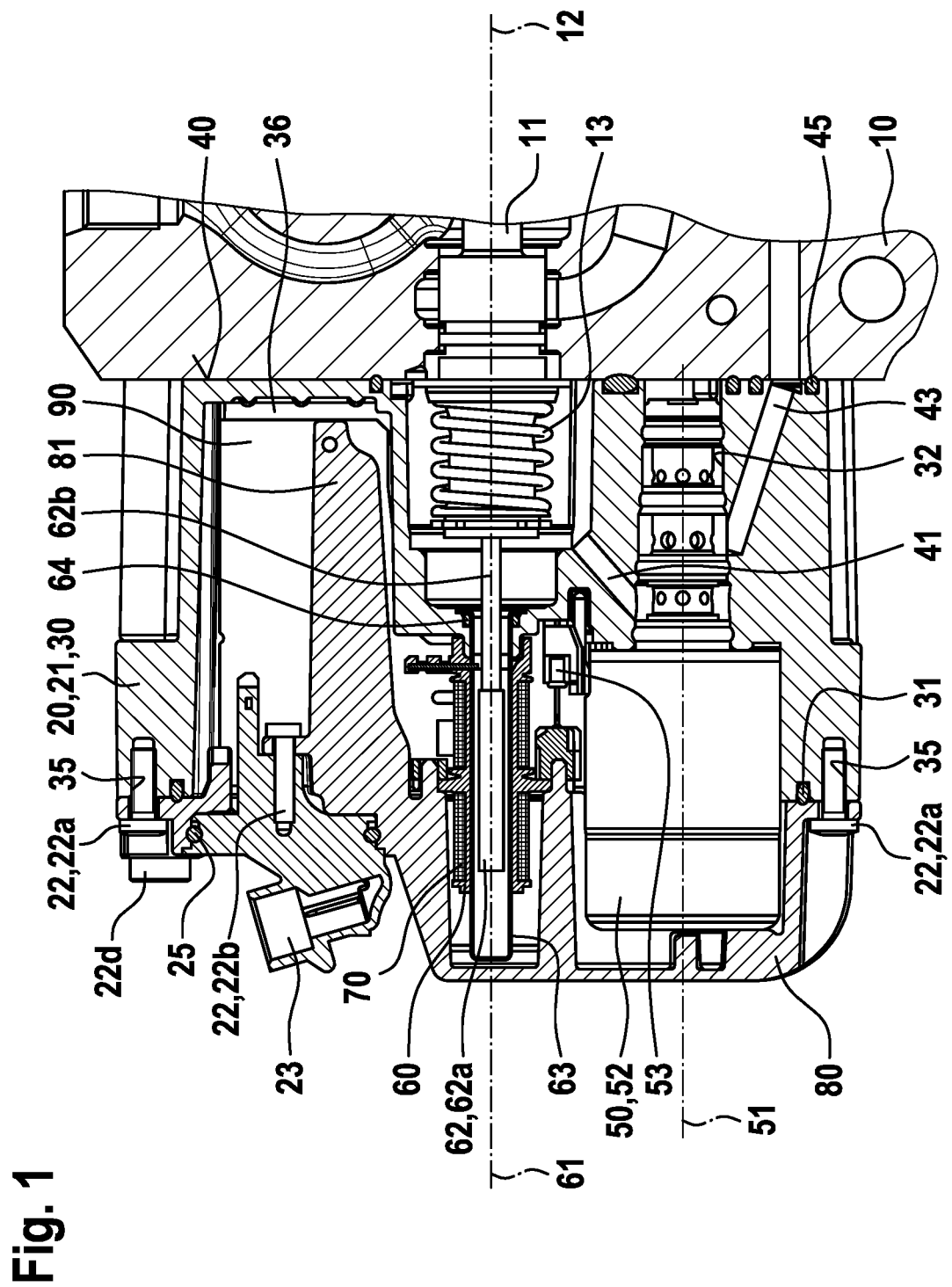
FIG. 1 a longitudinal section of a pilot device according to the disclosure, wherein the associated directional valve is illustrated in part.

FIG. 1 shows a longitudinal section of a pilot device 20 according to the disclosure, wherein the associated directional valve 10 is illustrated in part. The pilot device 20 comprises a housing 21, which is composed of a base body 30 and a cover 80. The base body 30 and/or the cover 80 are preferably produced from aluminum or zinc in an injection molding procedure. The base body 30 has a planar mounting surface 40, which is aligned perpendicularly to a longitudinal axis 12. The mounting surface 40 abuts against the directional valve 10, wherein the pilot device 20 is preferably screwed to the directional valve 10. The directional valve 10 has a control spool 11, which is linearly movable relative to the longitudinal axis 12. The control spool 11 is equipped with a restoring spring 13, which pre-tensions the control spool 11 in a central position, wherein it projects into the base body 30 of the pilot device 20. The position of the control spool 11 is adjusted hydraulically by means of the pilot device 20, wherein, for this purpose, the control device has a first control connection 41 and a second control connection (No. 42 in FIG. 2). The corresponding pressures act on the control spool 11 at the end face from opposite sides.

A pilot valve 50, which is formed in the manner of a cartridge valve, is received in the base body 30. The pilot valve 50 comprises an electrical actuating device 52, which is surrounded by the base body 30 and by the cover 80. The actuating device 52 preferably comprises at least one actuating coil, the pilot valve 50 being adjustable by the magnetic force thereof. The hydraulic portion of the pilot valve 50 is received in an associated receiving bore 32, which is formed solely by the base body 30. The pilot valve 50 is preferably formed in the manner of a 4/3-way valve, which also leads to the use of the term "volumetric control", in which volume flows alone are used to adjust the control spool and not pressures, as is the case with barometric control. The control valve has four fluid connections in total, which are accessible at the mounting surface 40, wherein further details will be explained with reference to FIG. 2. The pilot valve 50 has a valve axis 51, which is aligned parallel to the longitudinal axis 12. The pilot valve 50, with the exception of the connection socket 53, is preferably formed to be rotationally symmetrical relative to the valve axis 51. In the direction of the valve axis 51, it is held in the receiving bore 32 solely by the cover 80 of the pilot device 20.

A displacement sensor 60 is furthermore provided, which operates inductively in the present case. The displacement sensor 60 comprises a rod-like soft iron core 62, which is fixedly connected, in particular screwed and/or crimped, to the control spool 11. The soft iron core 62 therefore moves together with the control spool 11 along the longitudinal axis 12. The soft iron core 62 comprises a magnetically acting first portion 62a, which is designed to be ferromagnetic. The first portion 62a is connected to the control spool 11 via a non-magnetic second portion 62b. This results in good measuring accuracy of the displacement sensor 60. The soft iron core 62 is preferably formed to be circular-cylindrical relative to a sensor axis 61, wherein the second portion 62b preferably has a smaller diameter than the first portion 62a. The sensor axis 61 preferably coincides with the above-mentioned longitudinal axis 12 of the control spool 11. It extends, in particular, parallel to the valve axis 51 so that the sensor axis 61 and the spaced valve axis 51 span a reference plane.

Figure 4:
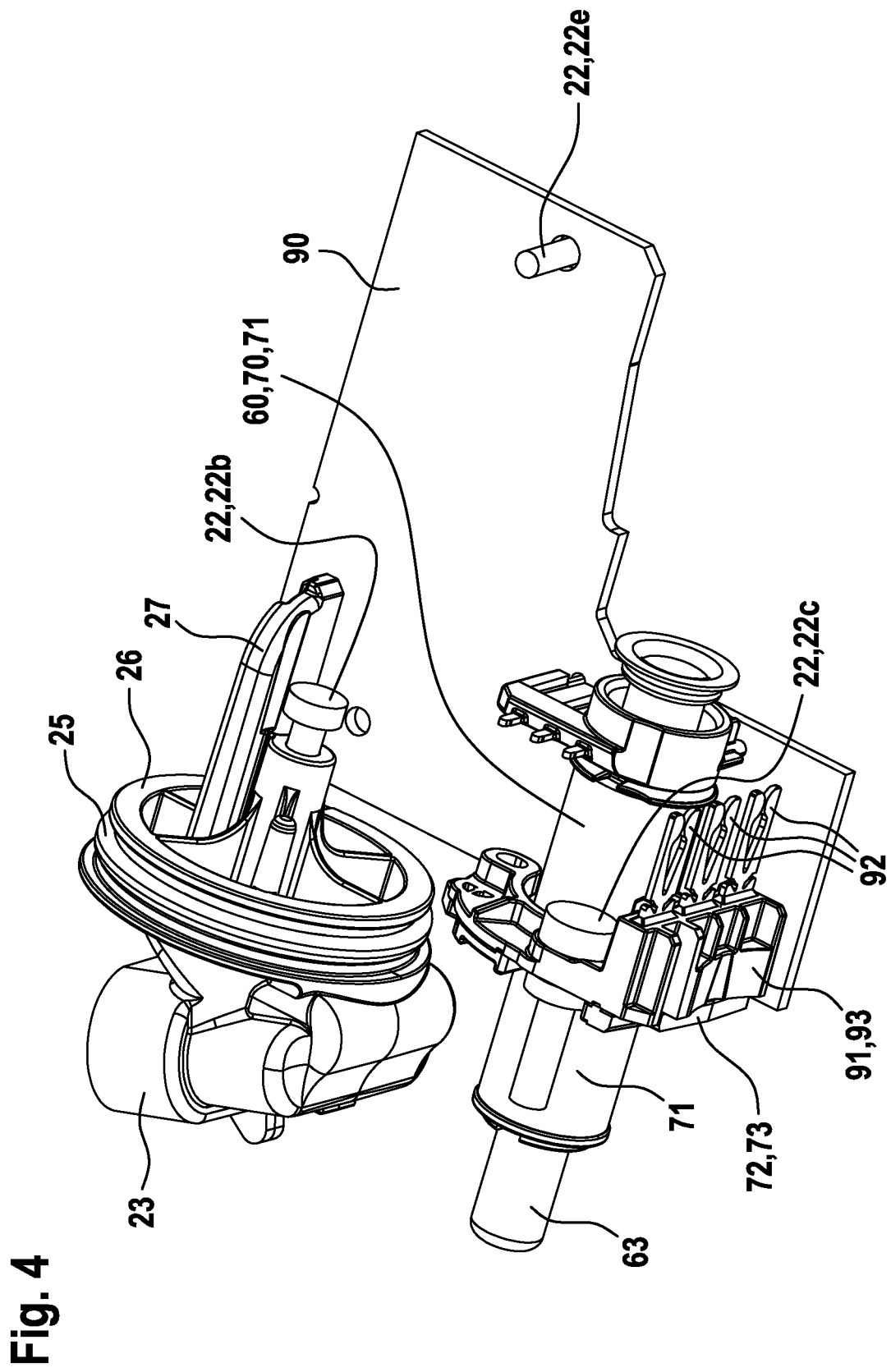
FIG. 4 a further perspective view of the assembly according to FIG. 3, without the cover and without the pilot valve.
Figure 5:
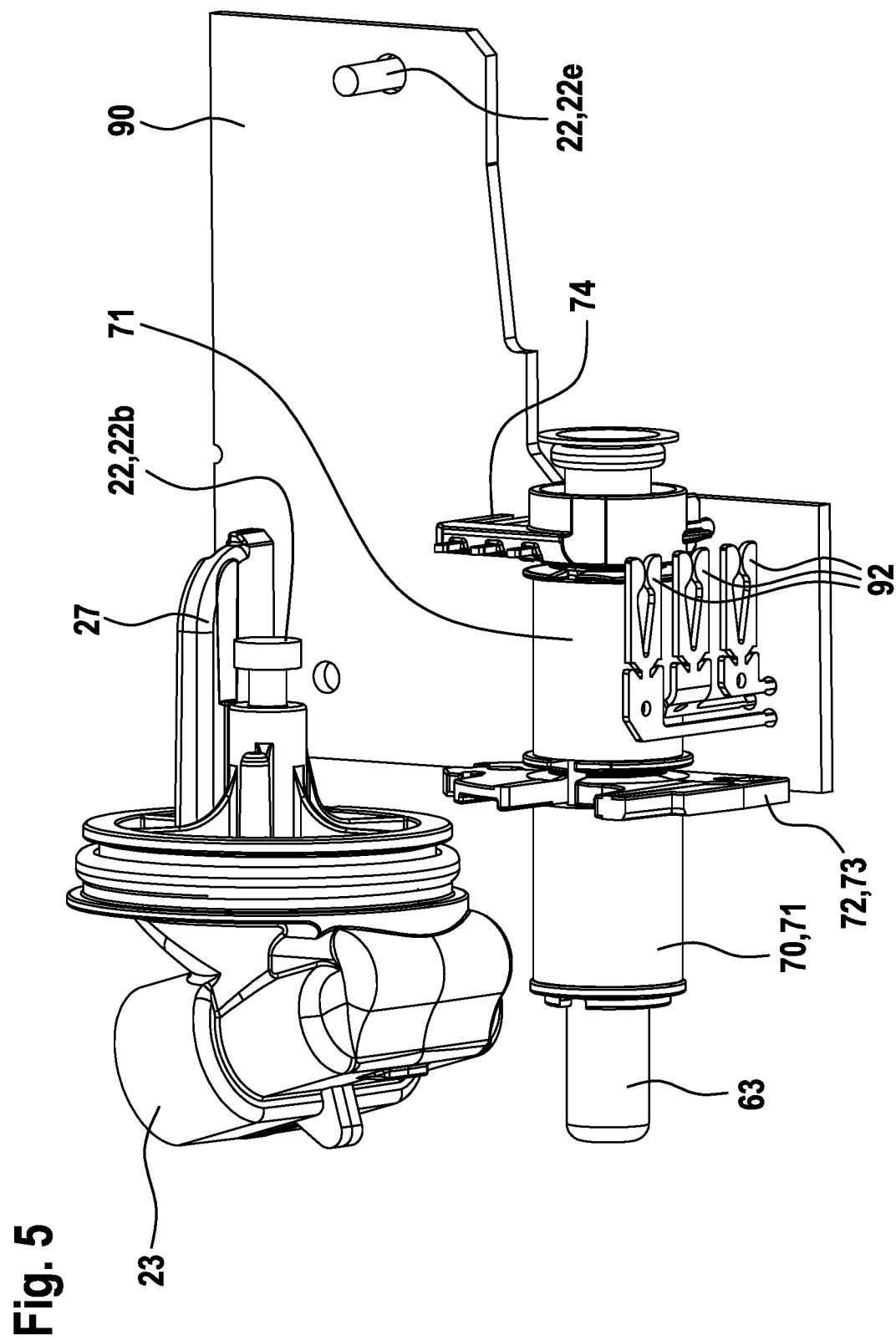
FIG. 5 a view corresponding to FIG. 4, wherein the plastic sheath of the contact assembly is omitted.

A pressure pipe 63 is arranged around the soft iron core 62. The pressure pipe 63 is formed in the manner of a jar, wherein it is preferably produced from sheet metal in a deep drawing procedure. It consists of a non-magnetic metal, in particular austenitic, stainless steel, so that it does not interfere with the inductive displacement measurement. At its open end, it is pressed into the base body 30, wherein the joint is preferably sealed by a sealing ring 64. The pressure within the pressure pipe 63 is applied at the first control connection 41, which presses the control spool 11 away from the pilot device 20. Owing to the seal between the base body 30 and the pressure pipe 63, the corresponding pressure fluid is unable to make its way into the region of the base body 30 in which the circuit board 90 is located. It goes without saying that the pilot valve 50 is likewise equipped with a seal so that fluid is also unable to make its way from there into the region of the base body 30 in which the circuit board 90 is arranged. A coil assembly 70, which will be explained in more detail with reference to FIGS. 4 and 5, is arranged around the pressure pipe 63.

Reference shall furthermore be made to the electrical plug connection 23, which is preferably formed as a plastic injection molded part in which corresponding metal contact portions are cast. A sealing ring 25 is arranged between the plug connection 23 and the cover 80 so that it is not possible for any medium, for example moisture, to enter therein from the outside.

The pilot device 20 is equipped with a plurality of fastening screws 22. The cover 80 is fastened to the base body 30 by the first fastening screws 22*a*. These penetrate the cover 80, wherein they are screwed into an associated bore 35 in the base body 30. The plug connection 23 is fastened to the cover 80 by the second fastening screw 22*b*. The coil assembly 70 is fastened to the cover 80 by the third fastening screw (No. 22*c* in FIG. 4). The base body 30 is fastened to the directional valve 10 by the total of four fourth fastening screws 22*d*. These penetrate a respective fastening bore (No. 33 in FIG. 2) in the base body 30, wherein they are screwed into the directional valve 10. The circuit board 90 is fastened to a bracket 81 of the cover 80 by the fifth fastening screw (No. 22*e* in FIG. 3).

Reference shall also be made to the circuit board 90, which is arranged parallel to the plane of the drawing in FIG. 1 and therefore parallel to the valve axis 51 and to the sensor axis 61. The circuit board 90 extends from the plug connection 23 via the displacement sensor 60 to the pilot valve 50. The electrical connections there are therefore each arranged in the immediate vicinity of the circuit board 90, wherein they are electrically connected to the circuit board 90 without using cables. The circuit board 90 is, in particular, a component of an electronic control unit, whereof the set value is provided at the plug connection 23, wherein its actual value is determined by the displacement sensor 60, wherein its manipulated variable is the setting of the pilot valve 50. The control unit can be designed as a constant linear controller, in particular as a PI controller. The linear controller is preferably implemented using a digital processor, wherein it can also be implemented by means of an analog circuit.

Figure 2:
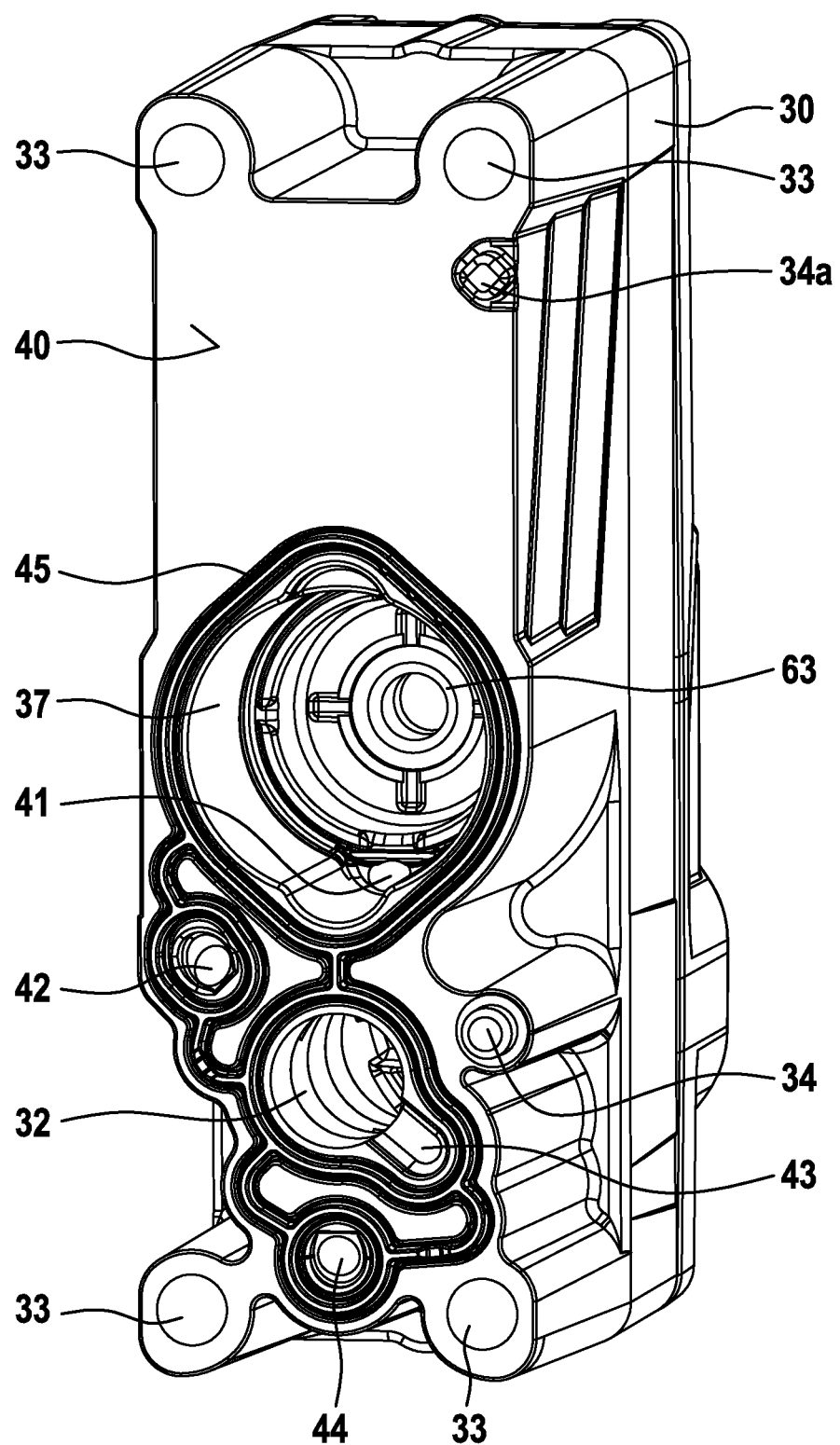
FIG. 2 a perspective view of the base body of the pilot device according to FIG. 1, from the mounting surface.

FIG. 2 shows a perspective view of the base body 30 of the pilot device according to FIG. 1 from the mounting surface 40. The substantially planar, rectangular mounting surface 40 is equipped with a respective fastening bore 33 at its four corner regions, which fastening bore is penetrated in each case by an associated fastening screw (No. 22*d* in FIG. 1).

Within the mounting surface 40, a total of four regions are delimited from one another in a fluid-tight manner by a single-piece seal 45 made of an elastomer. A first region forms the spring recess 37, in which the restoring spring (No. 13 in FIG. 1) is arranged, wherein the first control connection 41 leads out at the base of the spring recess 37. A further region forms the second control connection 42, which is fluidically connected to the pilot valve. A further region forms the fluid feed 43, via which the pilot device is supplied with pressurized pressure fluid, wherein this is conducted to the pilot valve. The pressure fluid is preferably a liquid and most preferably hydraulic oil. The fourth region forms a fluid return 44, via which pressure fluid can flow from the pilot valve back to the directional valve, wherein it is typically transferred to a tank there. The seal 45 is preferably received in an adapted groove in the mounting surface 40, wherein it abuts against a planar counter-surface on the directional valve.

In addition to the seal 45, a first alignment projection 34, which engages in an adapted recess in the directional valve, is arranged on the mounting surface 40. An analogous second alignment projection 34*a* is arranged at a spacing from the first alignment projection 34. This simplifies the installation, in particular the alignment of the pilot device on the directional valve.

It can furthermore be seen in FIG. 2 how the collar of the pressure pipe 63 abuts against the base of the spring recess 37.

Figure 3:
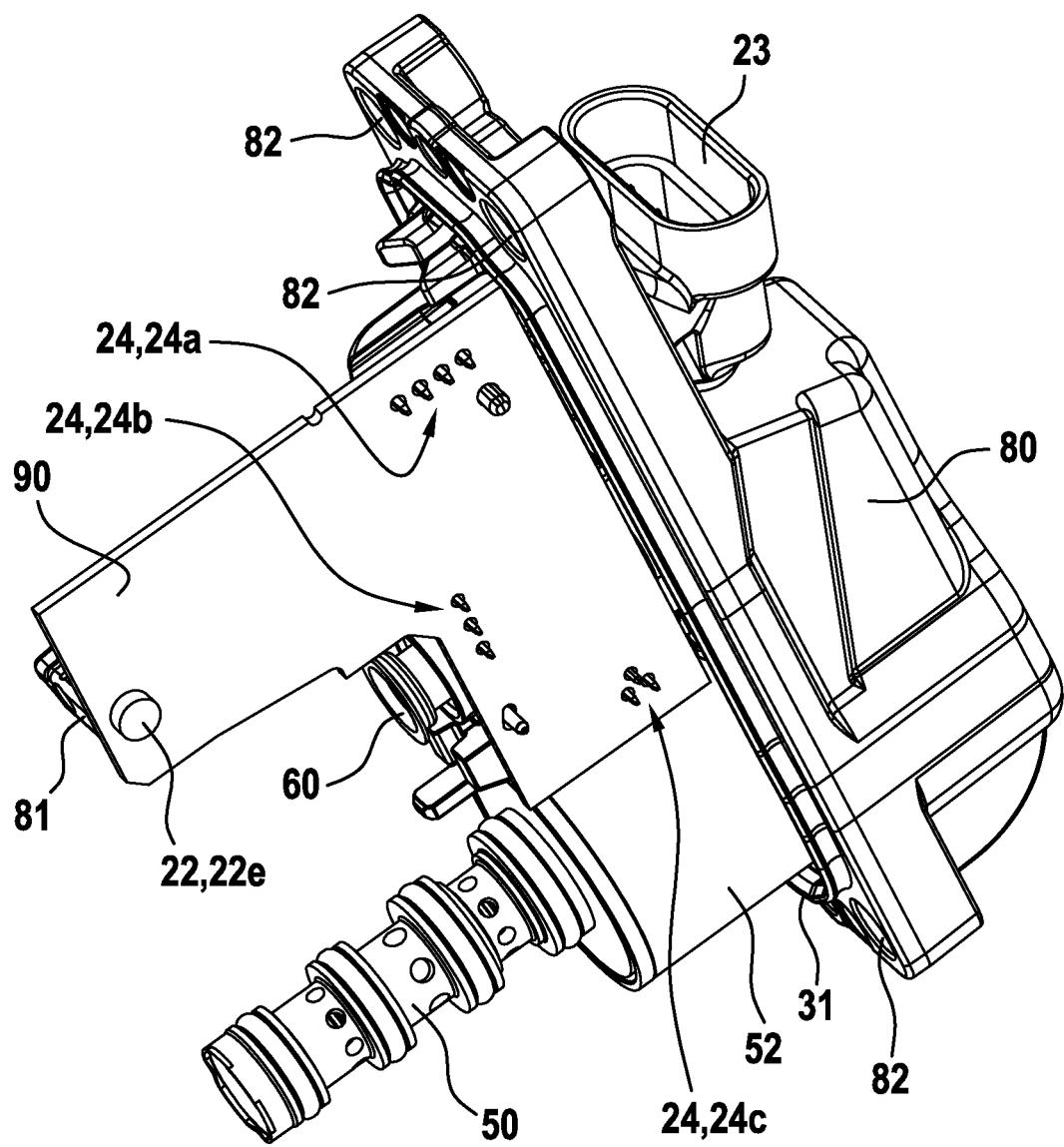
FIG. 3 a perspective view of the pilot device according to FIG. 1, without the base body.

FIG. 3 shows a perspective view of the pilot device according to FIG. 1, without the base body. It is possible to identify the circuit board 90, which is fastened to the cover 80. On the one hand, it is screwed by means of the fifth fastening screw 22*e* to a bracket 81 (see also FIG. 1) integrally formed in one piece on the cover 80, so that it is held mechanically rigid. Consequently, the circuit board 90 is not prone to mechanical vibrations when the pilot device is subjected to vibrational loads. Reference shall furthermore be made to the soldering points 24. These serve primarily for establishing an electrically conductive connection between the circuit board 90 and the plug connection 23, the displacement sensor 60 and the pilot valve 50. The soldering points 24 moreover indirectly form a mechanically fixed connection between the circuit board 90 and the cover 80, since the parts 50, 60, 23 are fixedly connected to the cover. Via the four first soldering points 24*a*, the circuit board 90 is electrically conductively connected to the plug connection 23, which has four corresponding contacts. Via the three second soldering points 24*b*, the circuit board 90 is electrically conductively connected to the two coils (No. 71 in FIG. 4) of the displacement sensor 60. In this case, one of the second soldering points 24*b* is connected to both coils, wherein the two other second soldering points 24*b* are connected to a single respectively associated coil. The three third soldering points 24*c* are connected to the electromagnetic actuating device 52 of the pilot valve 50. This preferably comprises two separate magnetic coils, which enable two opposing actuating directions, starting from an unactuated central position. The inventive configuration of the cover 80 is advantageous in that the above-mentioned soldering points 24 are particularly easily accessible within the assembly illustrated in FIG. 3.

Reference shall furthermore be made to the cover seal 31, which surrounds the circuit board 90, the plug connection 23, the displacement sensor 60 and the pilot valve 50 in a continuous manner. The cover seal 31 is made of an elastomer. It is received in an adapted groove in the base body, wherein it abuts against a planar sealing surface on the cover 80. The four fastening bores 82 on the cover 80 are arranged flush with the fastening bores (No. 33 in FIG. 2) in the base body.

FIG. 4 shows a further perspective view of the assembly according to FIG. 3 without the cover and without the pilot valve. It is particularly possible to identify the plug connection 23, which, in an injection molding procedure, is produced from plastic in one piece with a flange portion 26 and a connecting portion 27. A total of four metal parts are cast in this plastic part such that they are electrically insulated from one another. These metal parts each terminate in the plug connection 23 at one end and at an associated first soldering point (No. 24a in FIG. 3) at the other. The flange portion is formed to be substantially plate-like with a circular-cylindrical circumferential surface. The circumferential surface abuts tightly against an adapted countersurface on the cover, wherein the corresponding joint is sealed by a sealing ring 25. The second fastening screw 22b penetrates the cover (see FIG. 2) and is screwed into the flange portion 26. The connecting portion 27 extends from the flange portion 26 to the first soldering points, wherein, in particular, it keeps the above-mentioned metal parts electrically insulated from one another.

The displacement sensor 60 is furthermore illustrated without the soft iron core. It is particularly possible to identify the coil assembly 70, which comprises the two substantially mutually identically formed coils 71. The coil assembly 70 is penetrated with little play by the above-mentioned pressure pipe, which is fastened to the base body. The coil assembly comprises a coil holder 72, which is produced from plastic in an injection molding procedure. This is formed to be substantially tube-like, wherein the two coils 71 are wound on its outer surface. A plate-like fastening portion 73 is arranged in one piece on the coil holder 72, between the two coils 71. The third fastening screw 22c penetrates the contact assembly 91 and the fastening portion 73, wherein it is screwed into the cover (not illustrated). Accordingly, the coil assembly 70 and the contact assembly 91 are fixedly connected to the cover. Reference shall furthermore be made to the contact portion 74 integrally formed in one piece on the coil carrier. Three rod-like metal parts are placed or cast therein such that they are electrically insulated from one another, which metal parts are connected to the second soldering point (No. 24b in FIG. 3) at their one end, whilst being connected to the coils 71 at the other, opposite end.

The contact assembly 91, which produces the electrical contact with the pilot valve, can furthermore be identified in FIG. 4. It is revealed from the above that the plug connection 23 and the displacement sensor 60 are fixedly soldered to the circuit board 90. On the other hand, the pilot valve is connected to the circuit board 90 by means of a plug connection in order to simplify installation. The contact assembly 91 comprises three separate metal parts 92 for this, which each form a plug contact. The metal parts 92 are kept electrically insulated from one another by a plastic sheath 93. The contact assembly 91 is produced from plastic in an injection molding procedure, wherein the metal parts are placed in the casting mold before the liquid plastic is added, so that they are overmolded.

FIG. 5 shows a view corresponding to FIG. 4, wherein the plastic sheath of the contact assembly (No. 91 in FIG. 4) is omitted. Accordingly, it is possible to identify the shape of the three mentioned metal parts 92, which are each formed in an L shape so that they lead to the third soldering points (No. 24c in FIG. 3). It can furthermore be seen that the coil holder 72 of the coil assembly 70 is formed separately from the contact assembly (No. 91 in FIG. 4). This simplifies the production of the corresponding parts in an injection molding procedure.

Figure 6:
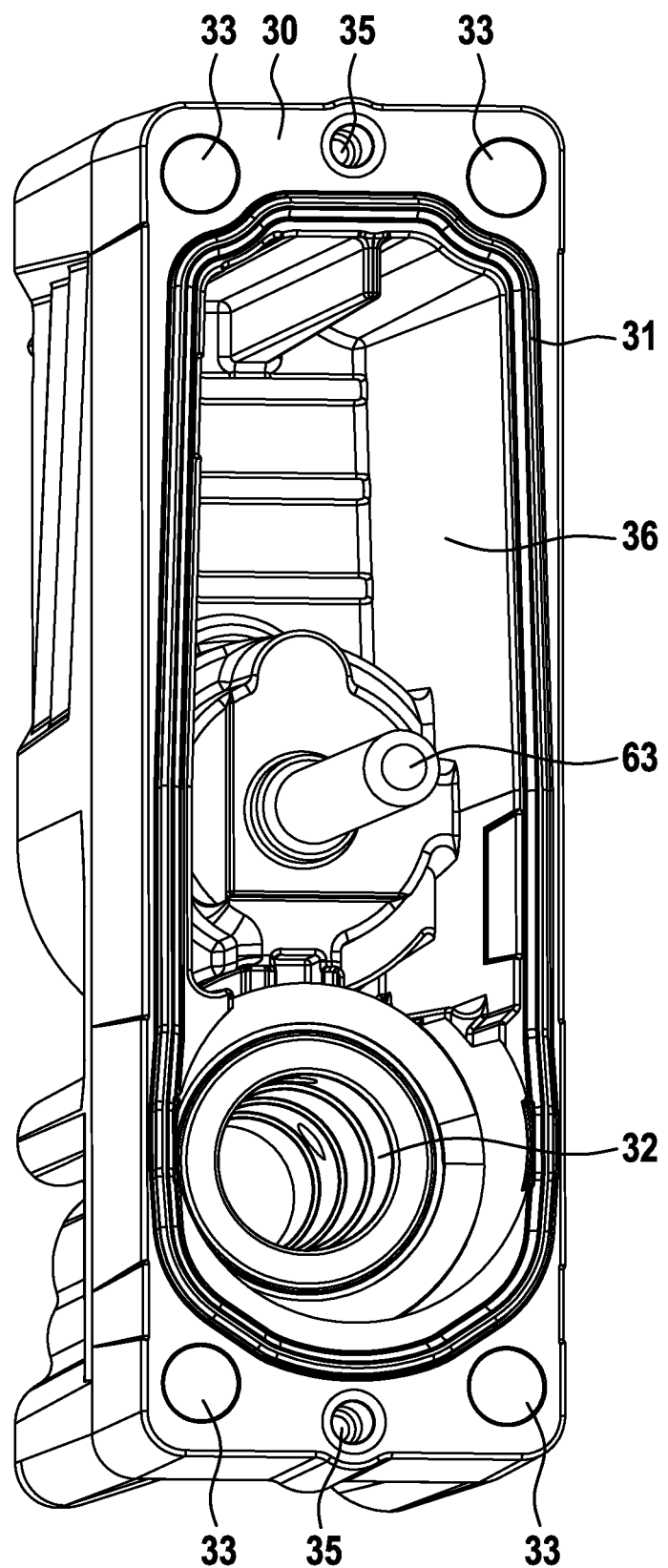
FIG. 6 a further perspective view of the base body according to FIG. 2, from the cover.

FIG. 6 shows a further perspective view of the base body 30 according to FIG. 2 from the cover (No. 80 in FIG. 1). Towards the cover, the base body 30 forms a circuit board recess 36 which is closed in a fully leak-proof manner by the cover on the one hand and by the hydraulic portion of the pilot valve on the other. The circuit board (No. 90 in FIG. 3) and the bracket (No. 81 in FIG. 3) project into the circuit board recess 36, finding adequate space therein. In this case, the assembly illustrated in FIG. 3, without the pilot valve, must be aligned precisely on the pressure pipe 63, on the connection socket (No. 53 in FIG. 1) and on the actuating device (No. 52 in FIG. 1) of the pilot valve. Installation is correspondingly simple. The first fastening screws (No. 22a in FIG. 1) are screwed into the bores 35 in order to fasten the cover on the base body, wherein two first fastening screws are preferably provided. The first fastening screws are preferably formed as self-tapping or thread-cutting screws.

LIST OF REFERENCE SIGNS

10 Directional valve
11 Control spool
12 Longitudinal axis
13 Restoring spring
20 Pilot device
21 Housing
22 Fastening screw
22a First fastening screw
22b Second fastening screw
22c Third fastening screw
22d Fourth fastening screw
22e Fifth fastening screw
23 Plug connection
24 Soldering point
24a First soldering point
24b Second soldering point
24c Third soldering point
25 Sealing ring
26 Flange portion
27 Connecting portion
30 Base body
31 Cover seal
32 Receiving bore
33 Fastening bore
34 First alignment projection
34a Second alignment projection
35 Bore
36 Circuit board recess
37 Spring recess
40 Mounting surface
41 First control connection
42 Second control connection
43 Fluid feed
44 Fluid return
45 Seal
50 Pilot valve
51 Valve axis
52 Actuating device
53 Connection socket
60 Displacement sensor
61 Sensor axis 62 Soft iron core
62a First portion of the soft iron core
62b Second portion of the soft iron core
63 Pressure pipe
64 Sealing ring
70 Coil assembly
71 Coil
72 Coil holder
73 Fastening portion
74 Contact portion
80 Cover
81 Bracket
82 Fastening bore
90 Circuit board
91 Contact assembly
92 Metal part
93 Plastic sheath

What is claimed is:

1. A pilot device for a hydraulic directional valve, comprising:
    a housing configured to be mounted externally on the hydraulic directional valve via a mounting surface, the housing equipped with an electrical plug connection that is accessible from the outside;
    a pilot valve received within the housing and configured as a cartridge valve having a valve axis, the pilot valve including an electromagnetic actuating device;
    a displacement sensor received within the housing, the displacement sensor including a soft iron core, which, in the region of the mounting surface, is coupled for movement to a control spool of the displacement valve so that the soft iron core is linearly movable along a sensor axis;
    an electronic circuit board received within the housing;
    a fluid feed, a fluid return, a first control connection, and a second control connection (i) defined in the housing in the region of the mounting surface and (ii) fluidically connected to the pilot valve within the housing; and
    at least two coils arranged around the soft iron core, the at least two coils combined to form a coil assembly,
    wherein the valve axis and the sensor axis are arranged substantially parallel to one another so that the valve axis and the sensor axis define a reference plane,
    wherein the electromagnetic actuating device and the coil assembly are arranged adjacent to one another,
    wherein the circuit board extends in a plane that is parallel to the reference plane,
    wherein, to establish an electrical contact, each of the coil assembly, the electromagnetic actuating device, and the electrical plug connection is either (i) soldered directly to the circuit board or (ii) is in breakable electrical contact with a respectively associated, rigid contact assembly, which is soldered directly to the circuit board.

2. The pilot device according to claim 1, wherein the rigid contact assembly is associated with the electromagnetic actuating device, and the electrical plug connection and the coil assembly are soldered directly to the circuit board.

3. The pilot device according to claim 2, wherein:
    the rigid contact assembly comprises at least two metal parts, each of which establishes a breakable electrical contact with the electromagnetic actuating device,
    the at least two metal parts are soldered directly to the circuit board, and
    the at least two metal parts are overmolded with a plastic sheath so that the at least two metal parts are fixedly held by the plastic sheath.

4. The pilot device according to claim 3, wherein the electrical contact between the electromagnetic actuating device and the rigid contact assembly is configured to be established and broken by a relative movement between the electromagnetic actuating device and the rigid contact assembly in the direction of the valve axis.

5. The pilot device according to claim 1, wherein:
    the housing comprises a base body and a cover,
    the mounting surface is arranged on the base body,
    the cover is arranged on a side of the base body opposite the mounting surface, and
    the circuit board and the electrical plug connection and the coil assembly are fastened to the cover.

6. The pilot device according to claim 5, wherein the circuit board, the coil assembly, the electrical plug connection, and the rigid contact assembly project out of the cover so that the associated soldering points are accessible for a soldering operation when the cover is not installed on the base body.

7. The pilot device according to claim 5, wherein sections of the pilot valve are incorporated in a receiving bore in the base body such that the fluid connection to the fluid feed, to the fluid return, and to the first and second control connections extends exclusively in the base body.

8. A pilot device for a hydraulic directional valve, comprising:
    a housing configured to be mounted externally on the hydraulic directional valve via a mounting surface, the housing equipped with an electrical plug connection that is accessible from the outside;
    a pilot valve received within the housing and configured as a cartridge valve having a valve axis, the pilot valve including an electromagnetic actuating device;
    a displacement sensor received within the housing, the displacement sensor including a soft iron core, which, in the region of the mounting surface, is coupled for movement to a control spool of the displacement valve so that the soft iron core is linearly movable along a sensor axis;
    an electronic circuit board received within the housing;
    a fluid feed, a fluid return, a first control connection, and a second control connection (i) defined in the housing in the region of the mounting surface and (ii) fluidically connected to the pilot valve within the housing; and
    at least two coils arranged around the soft iron core, the at least two coils combined to form a coil assembly,
    wherein:
    the valve axis and the sensor axis are arranged substantially parallel to one another so that the valve axis and the sensor axis define a reference plane,
    the electromagnetic actuating device and the coil assembly are arranged adjacent to one another,
    the circuit board extends in a plane that is parallel to the reference plane,
    to establish an electrical contact, each of the coil assembly, the electromagnetic actuating device, and the electrical plug connection is either (i) soldered directly to the circuit board or (ii) is in breakable electrical contact with a respectively associated, rigid contact assembly, which is soldered directly to the circuit board,
    the housing comprises a base body and a cover,
    the mounting surface is arranged on the base body,
    the cover is arranged on a side of the base body opposite the mounting surface,
    the circuit board and the electrical plug connection and the coil assembly are fastened to the cover, and a bracket, which extends in the direction of the sensor axis, is integrally formed in one piece on the cover, and wherein the circuit board is fastened to the bracket.

9. The pilot device according to claim 1, wherein:
the coil assembly comprises a separate pressure pipe in which the soft iron core is arranged,
the pressure pipe is surrounded by a coil holder made of plastic, which supports the at least two coils, and
the coil assembly is soldered to the circuit board in the region of a contact portion.

10. A pilot device for a hydraulic directional valve, comprising:
a housing configured to be mounted externally on the hydraulic directional valve via a mounting surface, the housing equipped with an electrical plug connection that is accessible from the outside;
a pilot valve received within the housing and configured as a cartridge valve having a valve axis, the pilot valve including an electromagnetic actuating device;
a displacement sensor received within the housing, the displacement sensor including a soft iron core, which, in the region of the mounting surface, is coupled for movement to a control spool of the displacement valve so that the soft iron core is linearly movable along a sensor axis;
an electronic circuit board received within the housing;
a fluid feed, a fluid return, a first control connection, and a second control connection (i) defined in the housing in the region of the mounting surface and (ii) fluidically connected to the pilot valve within the housing; and
at least two coils arranged around the soft iron core, the at least two coils combined to form a coil assembly, wherein:
the valve axis and the sensor axis are arranged substantially parallel to one another so that the valve axis and the sensor axis define a reference plane,
the electromagnetic actuating device and the coil assembly are arranged adjacent to one another,
the circuit board extends in a plane that is parallel to the reference plane,
to establish an electrical contact, each of the coil assembly, the electromagnetic actuating device, and the electrical plug connection is either (i) soldered directly to the circuit board or (ii) is in breakable electrical contact with a respectively associated, rigid contact assembly, which is soldered directly to the circuit board,
the coil assembly comprises a separate pressure pipe in which the soft iron core is arranged,
the pressure pipe is surrounded by a coil holder made of plastic, which supports the at least two coils,
the coil assembly is soldered to the circuit board in the region of a contact portion, and
the coil holder is configured in one piece and has a plate-like fastening portion that extends transversely to the sensor axis, and wherein the fastening portion is fastened to the cover.

11. The pilot device according to claim 10, wherein:
the rigid contact assembly comprises at least two metal parts, each of which is configured to establish breakable electrical contact with the coil assembly, the electromagnetic actuating device, or the electrical plug connection,
the metal parts are soldered directly to the circuit board,
the metal parts are overmolded with a plastic sheath so that the metal parts are fixedly held by the plastic sheath,
the plastic sheath abuts directly against the fastening portion, and
the plastic sheath and the fastening portion are penetrated by at least one common fastening screw that is screwed into the cover.

12. The pilot device according to claim 10, wherein the contact portion is configured in one piece on the coil holder and is arranged spaced from the fastening portion in the direction of the sensor axis.

* * * * *